United States Patent
Kuong et al.

(10) Patent No.: US 10,541,223 B2
(45) Date of Patent: Jan. 21, 2020

(54) METHODS OF OPERATING A WIRE BONDING MACHINE TO IMPROVE CLAMPING OF A SUBSTRATE, AND WIRE BONDING MACHINES

(71) Applicant: Kulicke and Soffa Industries, Inc., Fort Washington, PA (US)

(72) Inventors: Wong Hing Kuong, Singapore (SG); Samuel Capistrano, III, Singapore (SG); Peter Peh, Singapore (SG); Liu Yang, Singapore (SG); Kamal Gupta, Singapore (SG)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 145 days.

(21) Appl. No.: 15/967,191

(22) Filed: Apr. 30, 2018

(65) Prior Publication Data
US 2018/0323167 A1 Nov. 8, 2018

Related U.S. Application Data

(60) Provisional application No. 62/502,119, filed on May 5, 2017.

(51) Int. Cl.
*B23K 20/00* (2006.01)
*H01L 23/00* (2006.01)
(Continued)

(52) U.S. Cl.
CPC ............ *H01L 24/78* (2013.01); *B23K 20/004* (2013.01); *B23K 37/0408* (2013.01);
(Continued)

(58) Field of Classification Search
CPC .................. H01L 24/78; H01L 24/85; H01L 2224/48247; H01L 2224/787;
(Continued)

(56) References Cited

U.S. PATENT DOCUMENTS

| 4,050,618 A * | 9/1977 | Angelucci, Sr. ........ H01L 24/79 228/6.2 |
| 5,035,034 A * | 7/1991 | Cotney ............. H01L 21/67144 29/25.01 |

(Continued)

FOREIGN PATENT DOCUMENTS

| JP | 2001203222 A * | 7/2001 | ............ B25B 11/005 |
| KR | 101535739 B1 * | 7/2015 | |

OTHER PUBLICATIONS

Machine translation of KR-101535739-B1 (no date available).*

*Primary Examiner* — Kiley S Stoner
(74) *Attorney, Agent, or Firm* — Chrisopher M. Spletzer, Sr.

(57) ABSTRACT

A method of operating a wire bonding machine is provided. The method includes the steps of: (a) supporting a substrate on a material handling system of the wire bonding machine; (b) changing a bend profile of the substrate; and (c) securing, after step (b), the substrate against a support structure of the wire bonding machine using a clamping element of the wire bonding machine, the support structure for supporting the substrate during a wire bonding operation, and the clamping element for securing the substrate to the support structure during the wire bonding operation.

20 Claims, 14 Drawing Sheets

(51) Int. Cl.
*B23K 37/04* (2006.01)
*B23K 101/40* (2006.01)

(52) U.S. Cl.
CPC .......... *B23K 2101/40* (2018.08); *H01L 24/85* (2013.01); *H01L 2224/48247* (2013.01); *H01L 2224/787* (2013.01); *H01L 2224/7855* (2013.01); *H01L 2224/7865* (2013.01); *H01L 2224/78251* (2013.01); *H01L 2224/78704* (2013.01); *H01L 2224/78984* (2013.01); *H01L 2924/00014* (2013.01); *H01L 2924/3511* (2013.01)

(58) Field of Classification Search
CPC ... H01L 2924/3511; H01L 2224/78704; H01L 2224/7865; H01L 2924/00014; H01L 2224/7855; H01L 2224/78984; H01L 2224/78251; H01L 21/67011; H01L 21/673; H01L 21/683; B23K 20/004; B23K 37/0408; B23K 2101/40; B23K 20/005; B23K 20/007; B23K 37/0426–0461
USPC ........ 228/180.5, 4.5, 904, 164, 173.1–173.7, 228/4.1, 6.2, 15.1, 212–213, 44.3, 44.7, 228/49.5
See application file for complete search history.

(56) References Cited

U.S. PATENT DOCUMENTS

| | | | | | |
|---|---|---|---|---|---|
| 5,091,341 | A | * | 2/1992 | Asada | H01L 21/56 257/675 |
| 5,341,563 | A | * | 8/1994 | Kamakura | H01L 21/67138 29/743 |
| 5,647,528 | A | * | 7/1997 | Ball | B23K 20/004 228/180.5 |
| 5,673,845 | A | * | 10/1997 | Ball | B23K 20/004 228/180.5 |
| 5,796,161 | A | * | 8/1998 | Moon | H01L 21/67144 257/676 |
| 5,954,842 | A | * | 9/1999 | Fogal | B23K 20/004 29/25.01 |
| 5,975,835 | A | * | 11/1999 | Mochida | H01L 21/67721 414/751.1 |
| 6,105,846 | A | * | 8/2000 | Evers | B23K 20/004 228/4.5 |
| 6,121,674 | A | * | 9/2000 | Corisis | H01L 23/49503 257/666 |
| 6,261,501 | B1 | * | 7/2001 | Miyagawa | B29C 45/14655 257/E21.503 |
| 6,391,686 | B1 | * | 5/2002 | Shiozawa | H01L 24/32 257/E21.514 |
| 6,516,994 | B2 | * | 2/2003 | Takahashi | H01L 23/49503 228/180.5 |
| 6,547,121 | B2 | * | 4/2003 | Foong | H01L 21/67144 228/44.3 |
| 8,651,354 | B2 | * | 2/2014 | Luechinger | H01L 31/0504 156/580.1 |
| 2001/0050419 | A1 | * | 12/2001 | Tanaka | H01L 23/4334 257/666 |
| 2002/0015748 | A1 | * | 2/2002 | Miyajima | B29O 43/36 425/89 |
| 2005/0263566 | A1 | * | 12/2005 | Su | B23K 20/004 228/44.3 |
| 2007/0228502 | A1 | * | 10/2007 | Minamio | H01L 27/14618 257/431 |
| 2007/0287222 | A1 | * | 12/2007 | Natsume | B23K 20/004 438/104 |
| 2009/0243058 | A1 | * | 10/2009 | Shirasaka | H04R 1/04 257/670 |
| 2010/0078125 | A1 | * | 4/2010 | Fujino | H01L 21/67132 156/285 |
| 2014/0151341 | A1 | * | 6/2014 | Kuniyoshi | H01L 24/78 219/74 |
| 2014/0239473 | A1 | * | 8/2014 | Chia | H01L 24/78 257/676 |
| 2015/0078592 | A1 | * | 3/2015 | Uchida | H04R 19/04 381/191 |
| 2017/0077061 | A1 | * | 3/2017 | Onai | H01L 24/78 |
| 2018/0286702 | A1 | * | 10/2018 | Kawashima | H01L 23/49575 |

* cited by examiner

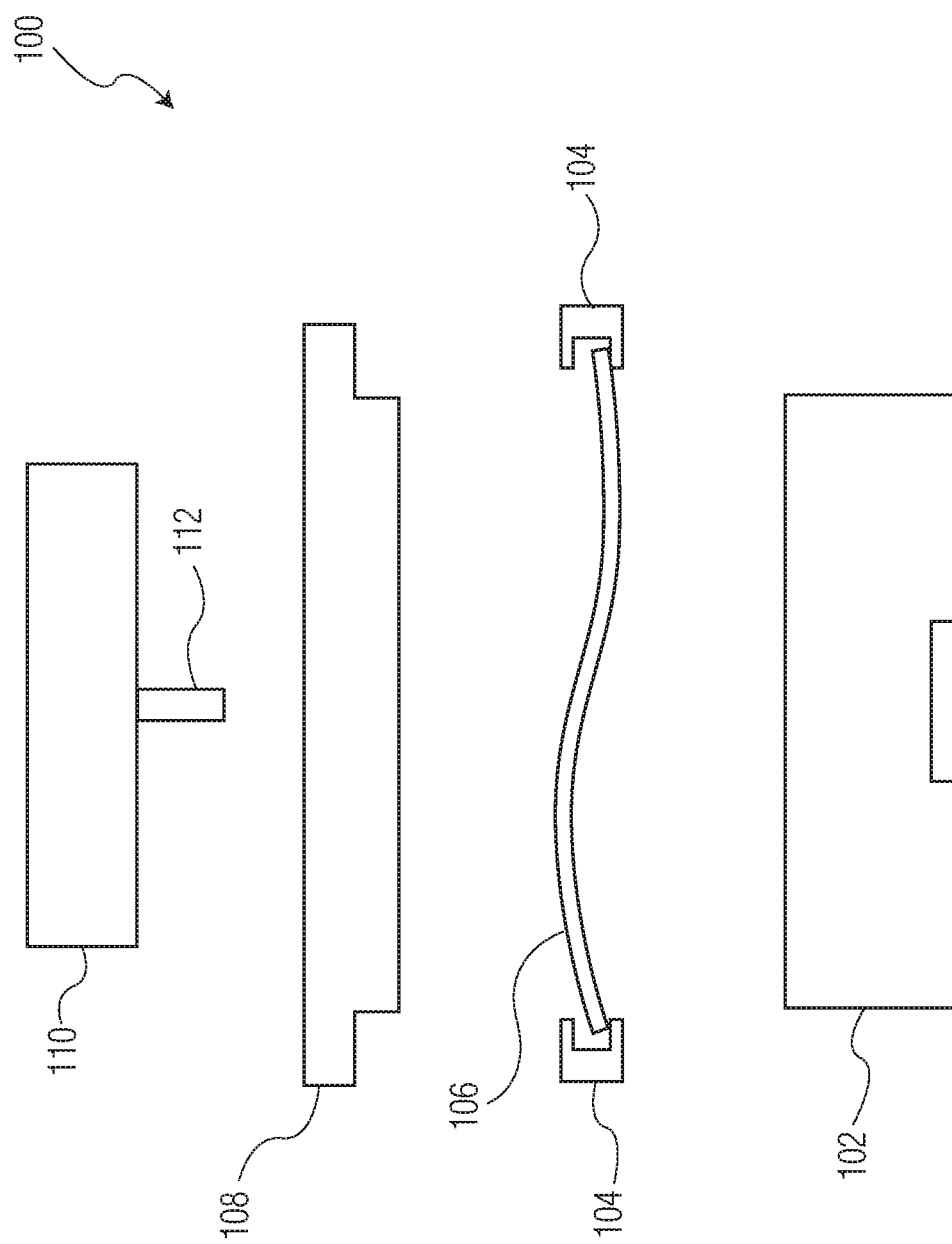

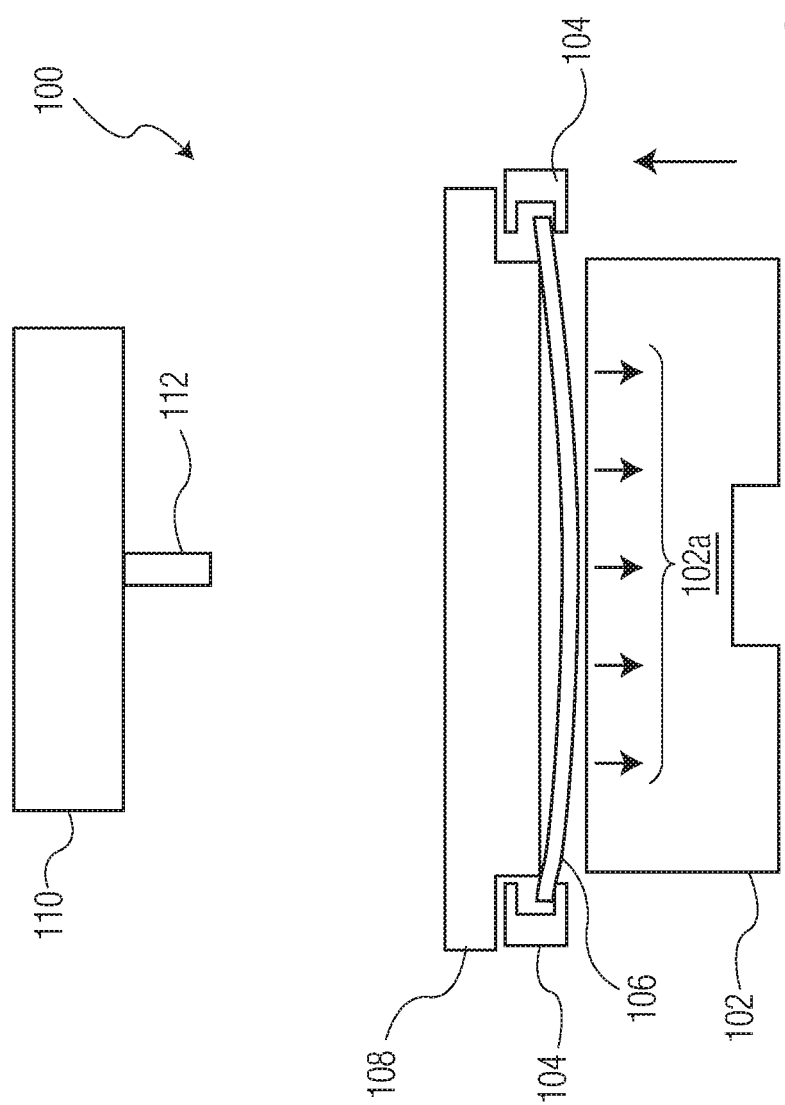

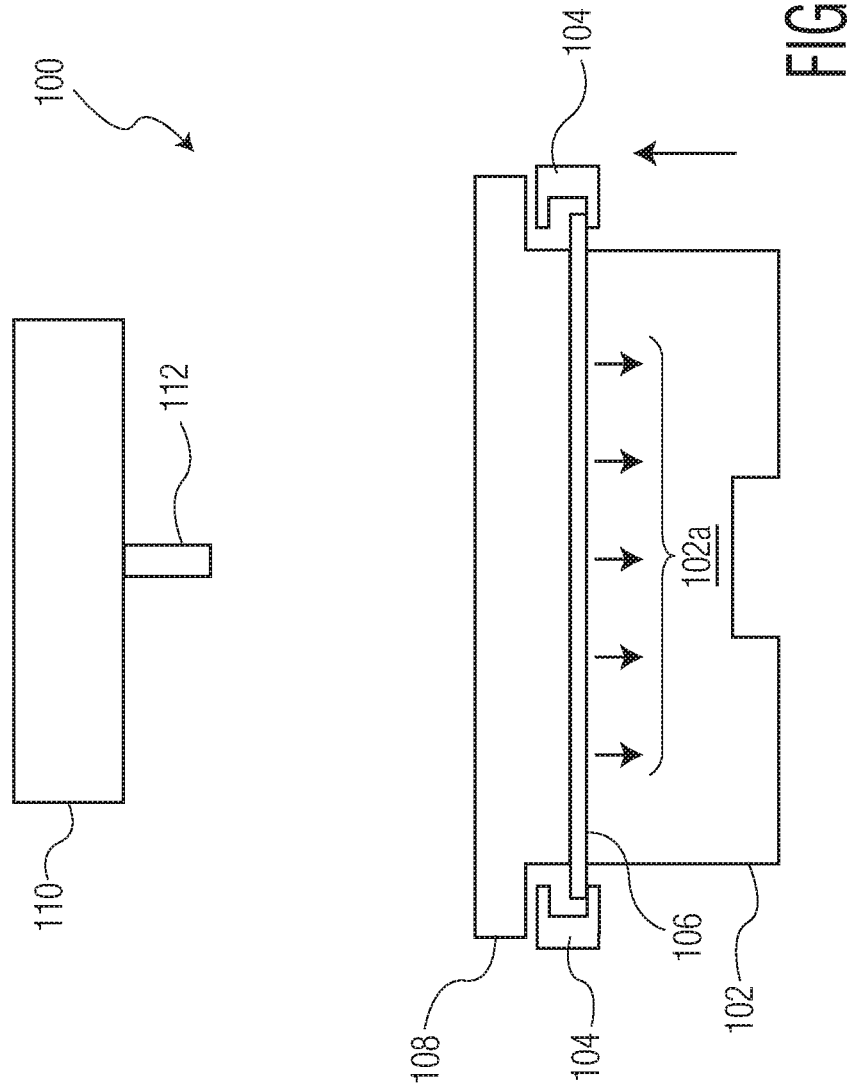

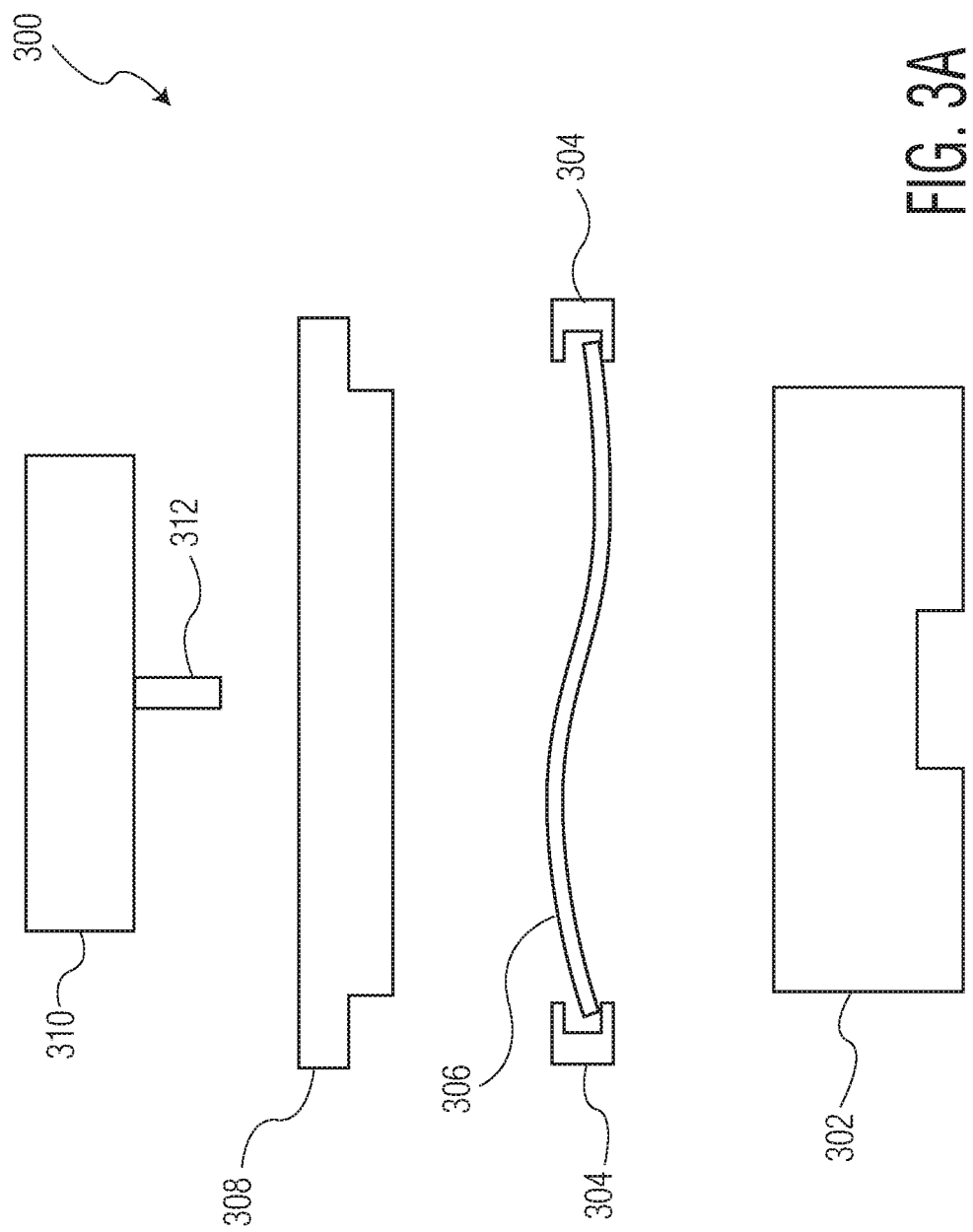

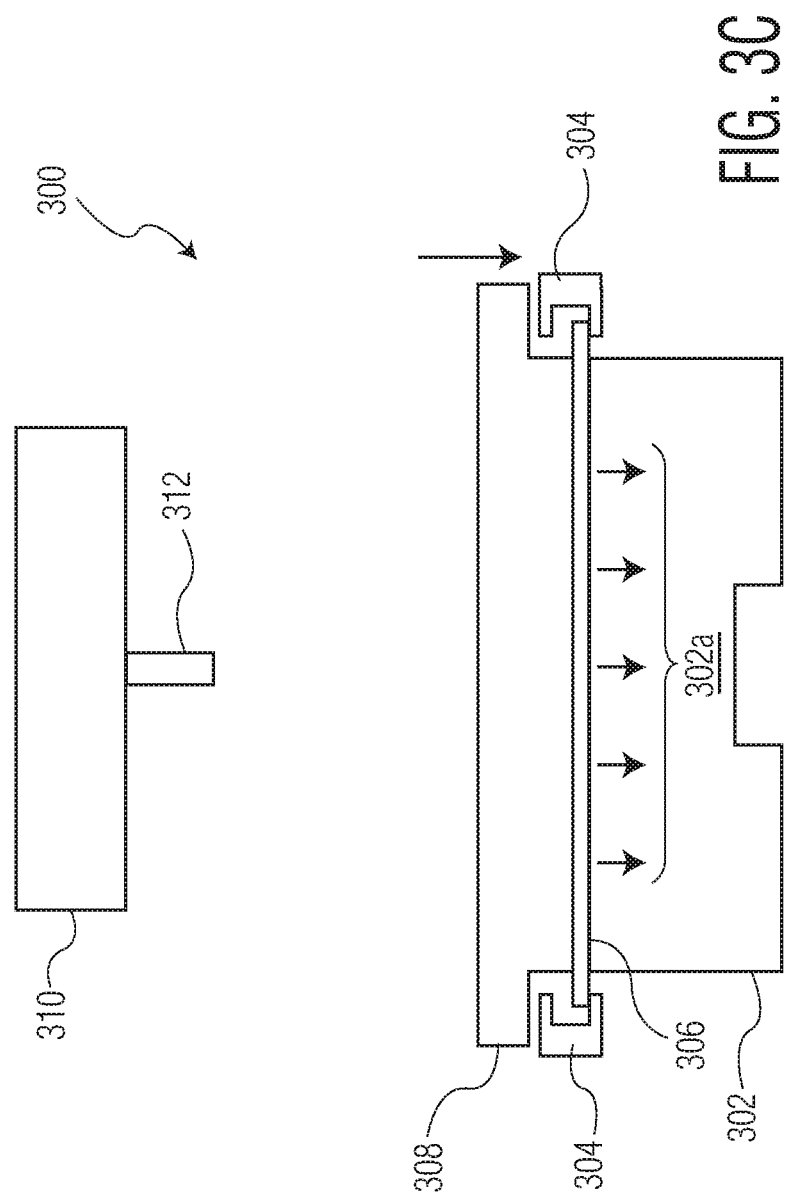

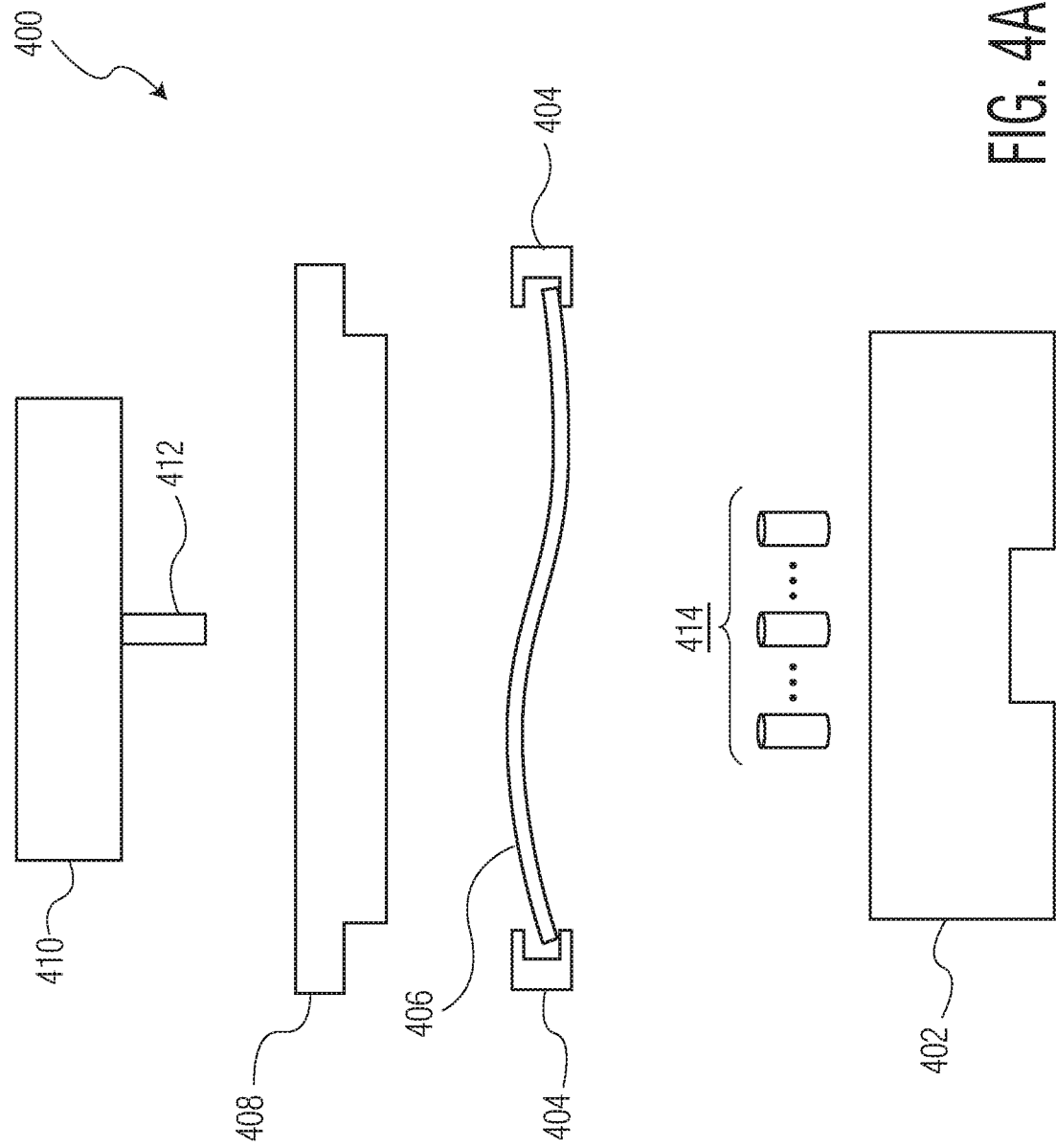

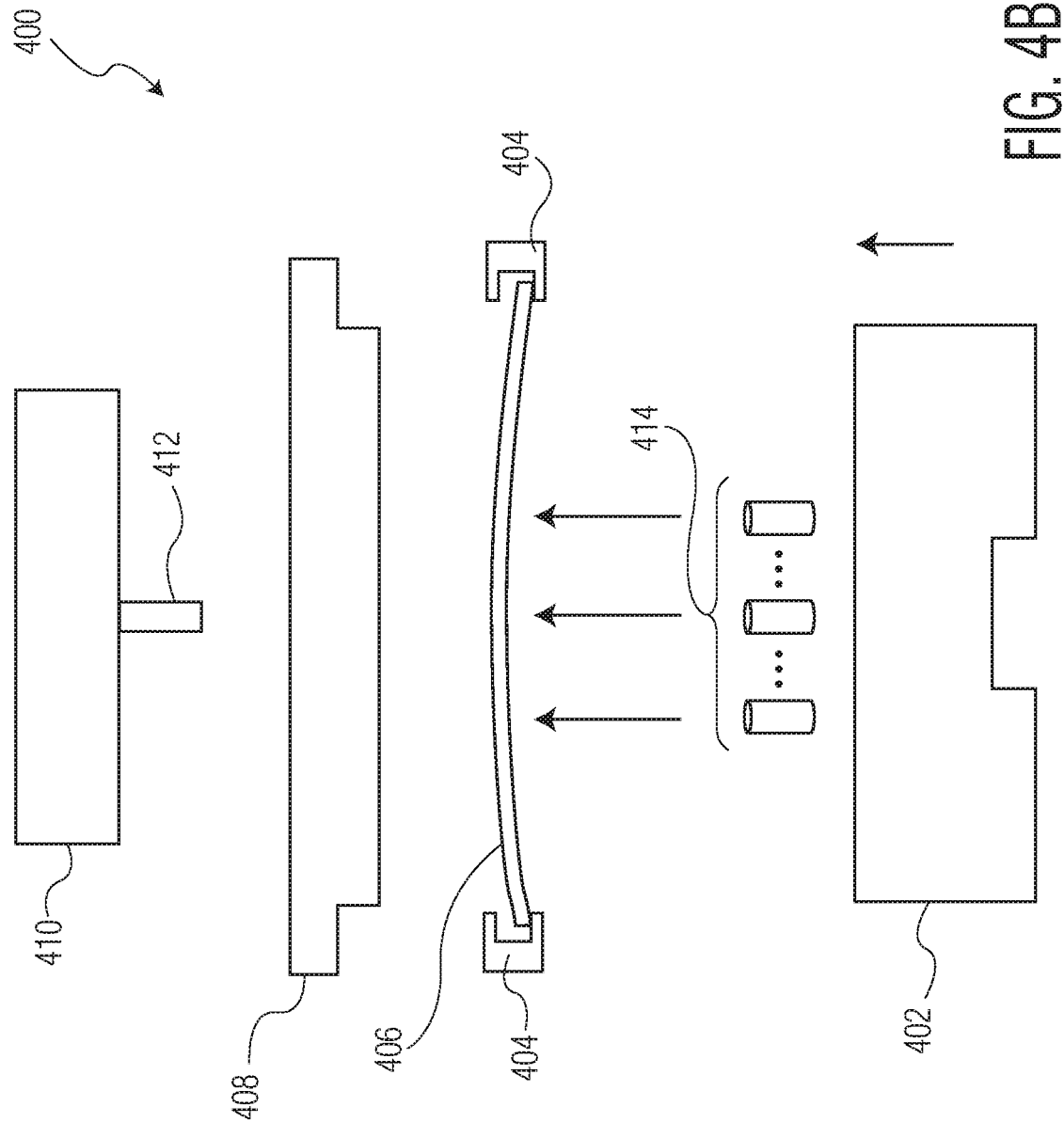

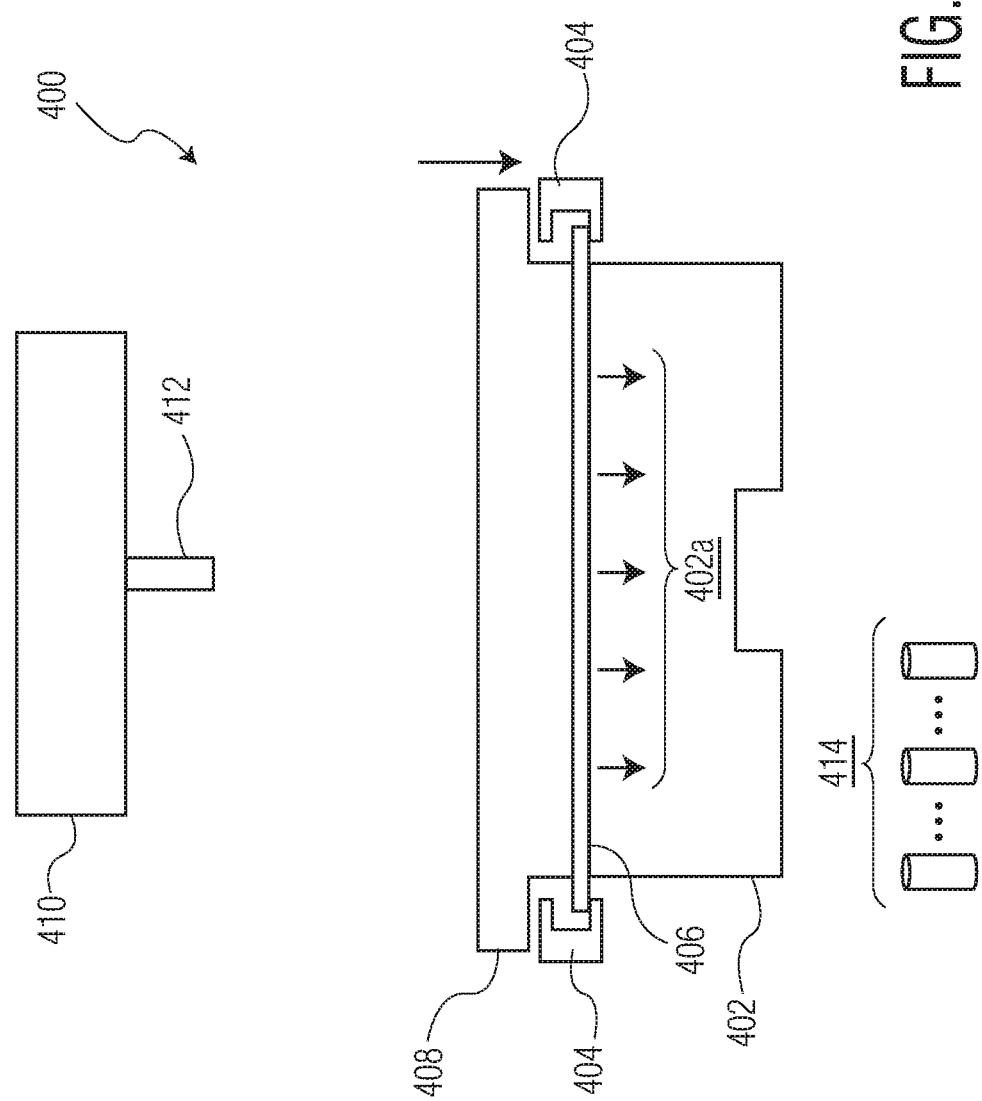

METHODS OF OPERATING A WIRE BONDING MACHINE TO IMPROVE CLAMPING OF A SUBSTRATE, AND WIRE BONDING MACHINES

CROSS-REFERENCE TO RELATED APPLICATION

This application claims the benefit of U.S. Provisional Application No. 62/502,119, filed May 5, 2017, the contents of which are incorporated herein by reference.

FIELD

The present invention relates to wire bonding machines, and more particularly, to improved methods of operating such wire bonding machines including improved methods of clamping a substrate.

SUMMARY

According to an exemplary embodiment of the invention, a method of operating a wire bonding machine is provided. The method includes the steps of: (a) supporting a substrate on a material handling system of the wire bonding machine; (b) changing a bend profile of the substrate; and (c) securing, after step (b), the substrate against a support structure of the wire bonding machine using a clamping element of the wire bonding machine, the support structure for supporting the substrate during a wire bonding operation, and the clamping element for securing the substrate to the support structure during the wire bonding operation.

According to another exemplary embodiment of the invention, a method of operating a wire bonding machine is provided. The method includes the steps of: (a) supporting a substrate on a material handling system of the wire bonding machine; (b) moving a clamping element of the wire bonding machine to be in contact with the substrate prior to contact between the substrate and a support structure of the wire bonding machine, the support structure for supporting the substrate during a wire bonding operation, the contact between the clamping element and the substrate changing a bend profile of the substrate; and (c) securing, after step (b), the substrate against the support structure using the clamping element of the wire bonding machine, the clamping element for securing the substrate to the support structure during the wire bonding operation.

According to yet another exemplary embodiment of the invention, a method of operating a wire bonding machine is provided. The method includes the steps of: (a) supporting a substrate on a material handling system of the wire bonding machine; (b) moving a support structure of the wire bonding machine to be in contact with the substrate prior to contact between the substrate and a clamping element of the wire bonding machine, the support structure for supporting the substrate during a wire bonding operation, the contact between the support structure and the substrate changing a bend profile of the substrate; and (c) securing, after step (b), the substrate against the support structure using the clamping element of the wire bonding machine, the clamping element for securing the substrate to the support structure during the wire bonding operation.

According to yet another exemplary embodiment of the invention, a method of operating a wire bonding machine is provided. The method includes the steps of: (a) supporting a substrate on a material handling system of the wire bonding machine; (b) changing a bend profile of the substrate using a fluid system of the wire bonding machine, the fluid system being configured to direct a fluid to change the bend profile of the substrate; and (c) securing, after step (b), the substrate against a support structure of the wire bonding machine using a clamping element of the wire bonding machine, the support structure for supporting the substrate during a wire bonding operation, and the clamping element for securing the substrate to the support structure during the wire bonding operation.

According to yet another exemplary embodiment of the invention, a wire bonding machine is provided. The wire bonding machine includes: a bond head assembly including a wire bonding tool for bonding a portion of wire to a substrate at a bonding area of the wire bonding machine; a material handling system for providing the substrate to the bonding area; a support structure for supporting the substrate during a wire bonding operation; a clamping element for securing the substrate to the support structure during the wire bonding operation; and a fluid system configured to direct a fluid to change a bend profile of the substrate.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 1A-1D are a series of side view block diagrams illustrating a method of operating a wire bonding machine in accordance with an exemplary embodiment of the invention;

FIGS. 3A-3C are a series of side view block diagrams illustrating a method of operating a wire bonding machine in accordance with yet another exemplary embodiment of the invention; and FIGS. 4A-4C are a series of side view block diagrams illustrating a method of operating a wire bonding machine in accordance with an exemplary embodiment of the invention.

DETAILED DESCRIPTION

Figure 1B:
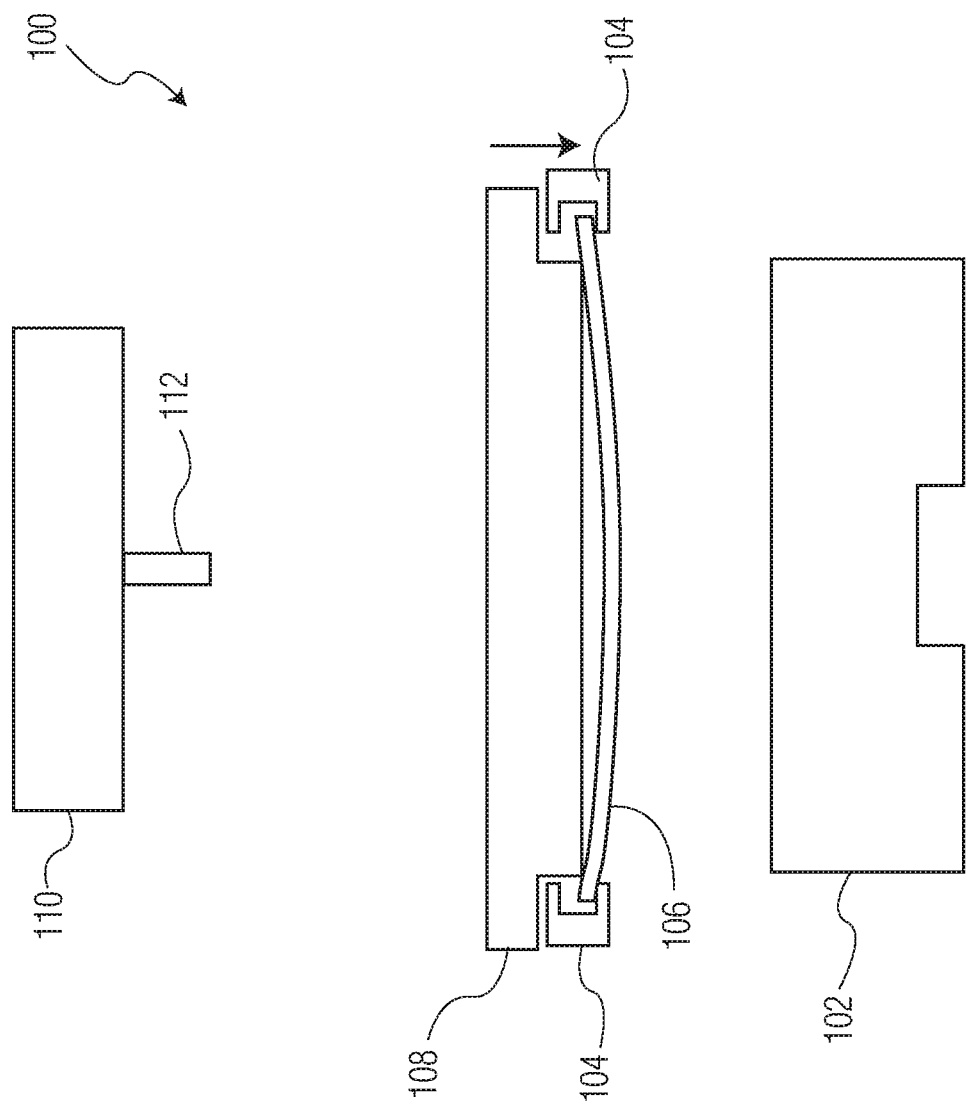

According to aspects of the invention, warpage of a substrate (e.g., a leadframe) is controlled and/or managed on a wire bonding machine, thereby improving the effectiveness of a vacuum clamping system of the machine. For example, methods and systems according to the invention are used to change a bend profile (e.g., a bend shape) of a substrate before clamping the substrate between a clamping element and a support structure. Examples of how the bend profile of the substrate may be changed include: (a) contacting the substrate with the clamping element before contact with the support structure to change the bend profile; (b) contacting the substrate with the support structure before contact with the clamping element to change the bend profile; and (c) using an air jet to change the bend profile of the substrate before clamping.

By changing the bend profile of a substrate (e.g., from a undesirable bend shape which may be warped, to a desirable bend shape), the vacuum clamping effectiveness of the support structure may be substantially improved. This improved vacuum clamping may substantially reduce intermittent vacuum error on the wire bonding machine. Such vacuum error may occur, for example, because of vacuum leaks between the substrate and support structure. Such leaks result primarily because of poor/inefficient contact between the support structure and the substrate, where such poor/inefficient contact tends to be brought about by undesirable substrate warpage.

In accordance with aspects of the invention, it will be appreciated that certain substrate bend profiles (e.g., problematic shape/direction/pattern of substrate warpage) are intentionally changed to a more desirable bend profile.

In certain examples, such a desirable bend profile tends to significantly control the initial contact between the support structure and the substrate during the closing motion of the clamp element by forcing the initial contact to happen near or in the center region of the substrate width. This control of the initial contact would cause the subsequent application of vacuum to be more effective and efficient as it maximizes the resulting contact area between the support structure and the substrate.

Aspects of the invention may incorporate a user controlled process such as a menu driven process. For example, a computer based interface (e.g., a graphical user interface) on the wire bonding machine may be utilized to program process details. For example, the motions of the clamping element and/or the support structure may be performed as a series of motions after contact with the substrate. In a specific example referring to FIG. 1B, clamping element 108 may be moved in a series of coordinated downward motions after contact with substrate 106. Likewise, the upward motion of support structure 102 in FIG. 1C may be moved in a series of coordinated upward motions after contact with substrate 106. These coordinated motions (including the distances traversed along the z-axis, and the timing of such motions) may be programmed to improve the contact between the substrate and the support structure and/or the clamping element. Similar controlled, coordinated motions of the clamping element and/or the support structure may be performed in the various embodiments included herein, including the embodiments of FIGS. 2A-2C, 3A-3C, and 4A-4C. Further, activation of the vacuum system (e.g., the vacuum system included in the support structure) may be timed along with the controlled, coordinated motions of the clamping element and/or the support structure to provide desirable substrate vacuum clamping through the support structure.

FIGS. 1A-1D illustrate elements of a wire bonding machine 100 used in connection with a method of operating the wire bonding machine 100. Specifically referring to FIG. 1A, a substrate 106 (e.g., a leadframe carrying a semiconductor die) is illustrated as being engaged between rails 104 of wire bonding machine 100. Rails 104 are part of a material handling system of wire bonding machine 100. Substrate 106 is shown having a warped bend profile. Such a bend profile may result in poor clamping during a wire bonding operation. Also shown in FIG. 1A is a support structure 102 (e.g., a heat block, an anvil, etc.) for supporting substrate 106 during a wire bonding operation, a clamping element 108 (e.g., a window clamp, a device clamp, a clamp insert, etc.) for securing substrate 106 to support structure 102 during the wire bonding operation, and a bond head assembly 110 carrying a bonding tool 112 for forming wire bonds on substrate 106. At FIG. 1B, clamping element 108 is moved downward to be in contact with substrate 106 prior to contact between substrate 106 and support structure 102. This contact between clamping element 108 and substrate 106 changes a bend profile of substrate 106. At FIG. 1C, support structure 102 is raised, and at FIG. 1D, substrate 106 is secured against support structure 102 using clamping element 108. Vaccum pressure 102a is shown drawn through support structure 102. With clamping element 108 securing substrate 106 against support structure 102, a wire bonding operation may be performed using wire bonding tool 112.

Figure 2A:
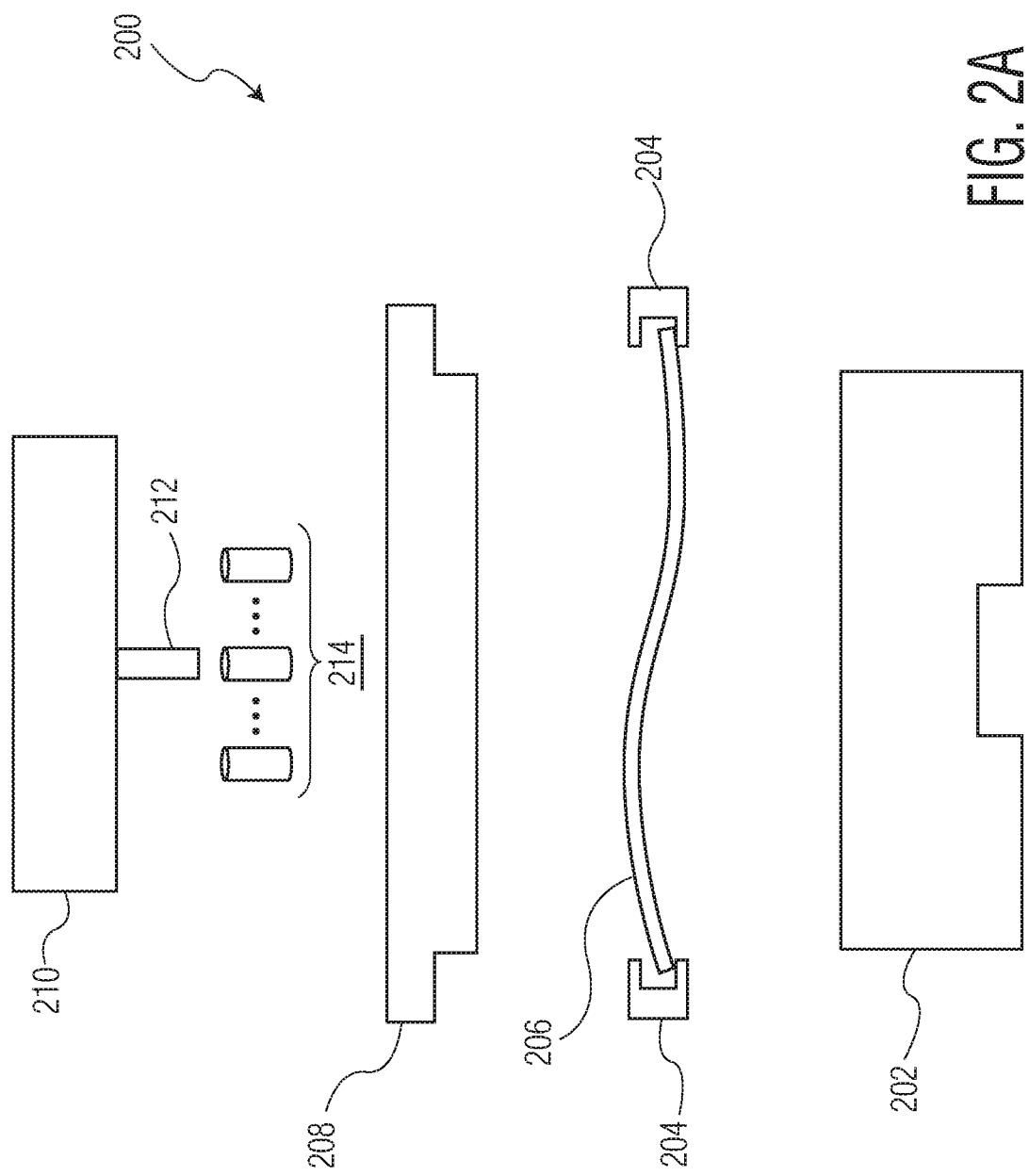
FIGS. 2A-2D are a series of side view block diagrams illustrating a method of operating a wire bonding machine in accordance with yet another exemplary embodiment of the invention.
Figure 2B:
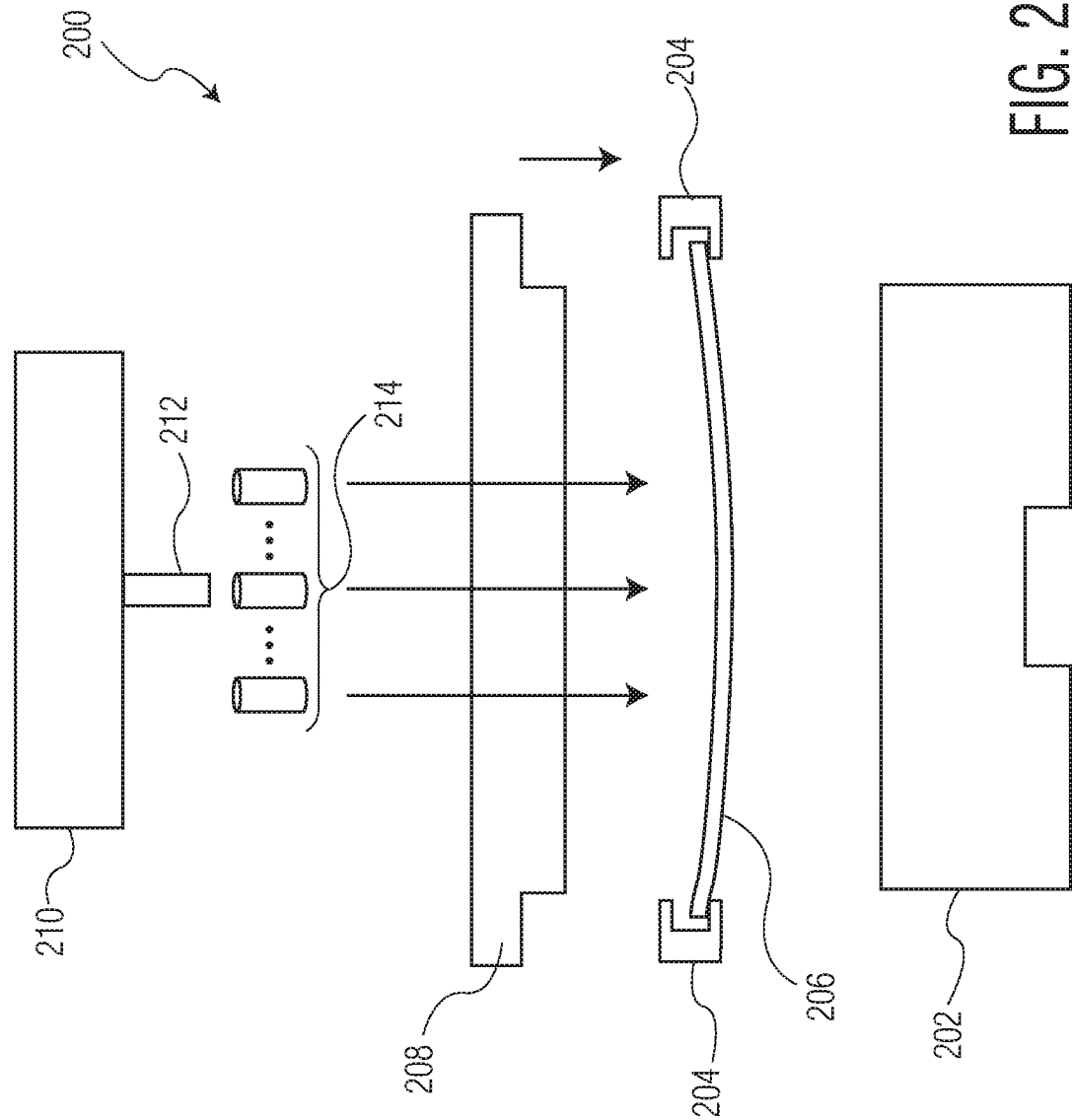
Figure 2C:
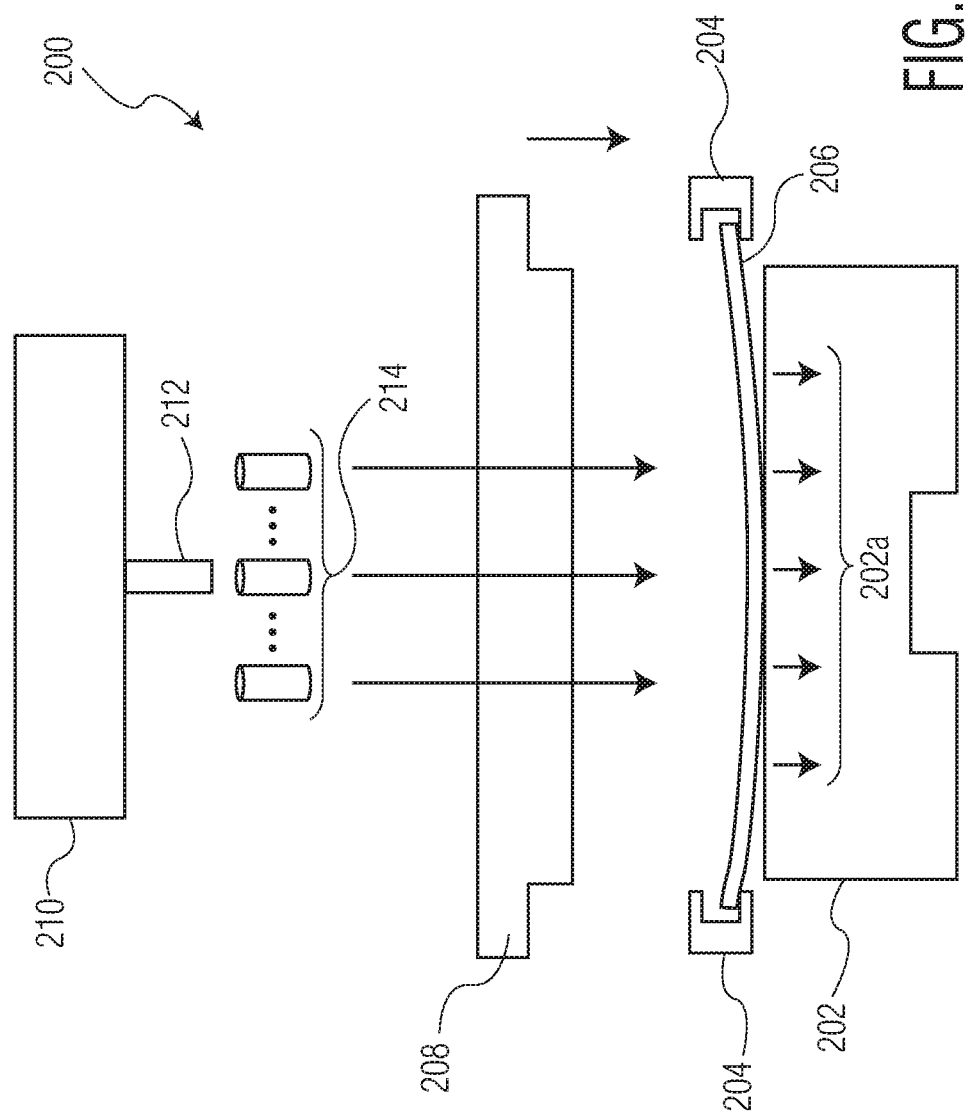
Figure 2D:
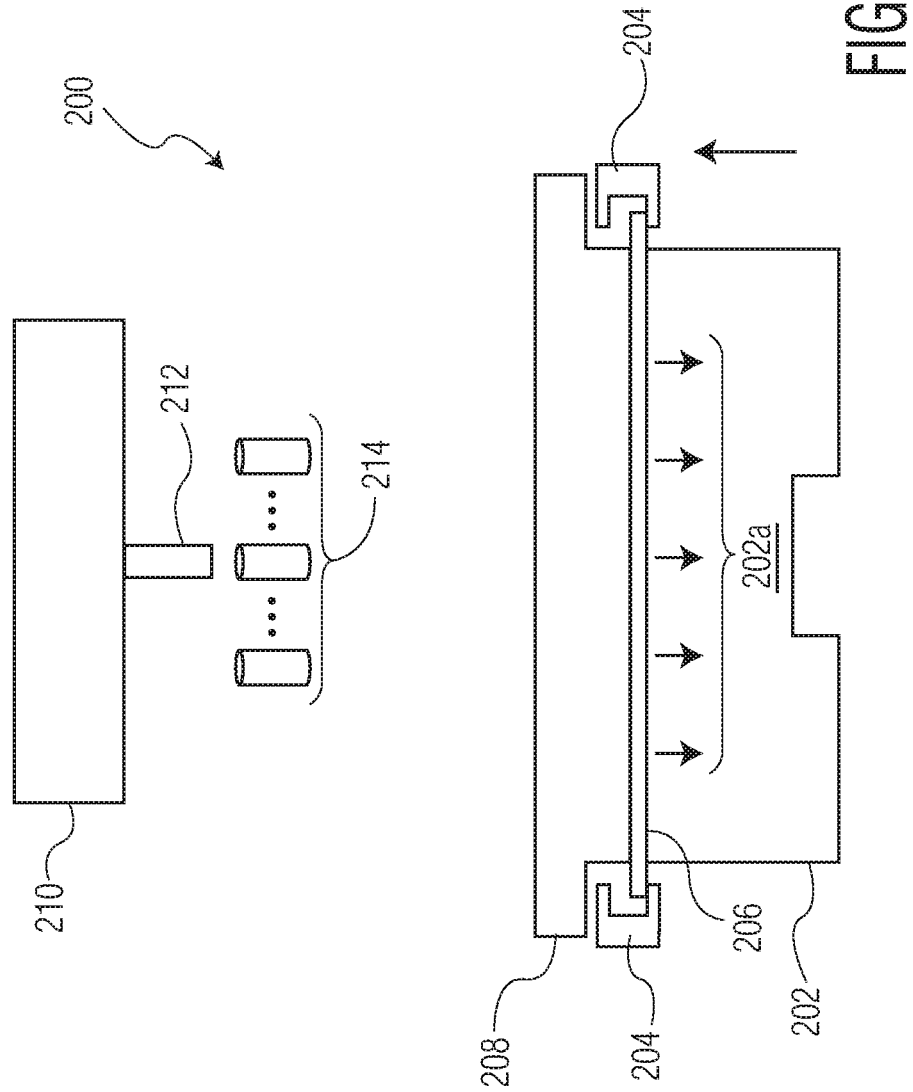

FIGS. 2A-2C illustrate elements of a wire bonding machine 200 used in connection with a method of operating the wire bonding machine 200. Specifically referring to FIG. 1A, a substrate 206 (e.g., a leadframe carrying a semiconductor die) is illustrated as being engaged between rails 204 of wire bonding machine 200. Rails 204 are part of a material handling system of wire bonding machine 200. Substrate 206 is shown having a warped bend profile. Such a bend profile may result in poor clamping during a wire bonding operation. Also shown in FIG. 2A is a support structure 202 (e.g., a heat block, an anvil, etc.) for supporting substrate 206 during a wire bonding operation, a clamping element 208 (e.g., a window clamp, a device clamp, a clamp insert, etc.) for securing substrate 206 to support structure 202 during the wire bonding operation, a bond head assembly 210 carrying a bonding tool 212 for forming wire bonds on substrate 206, and a fluid system 214 (e.g., an air jet system) to direct a fluid (e.g., air) from above substrate 206 to change the bend profile of substrate 206. At FIG. 2B, the fluid is directed downward from fluid system 214 toward substrate 206 to change a bend profile of substrate 206. At FIG. 2C, support structure 202 has been raised, clamping element 208 has been lowered, and substrate 206 is secured against support structure 202 using clamping element 208. Vaccum pressure 202a is shown drawn through support structure 202. With clamping element 208 securing substrate 206 against support structure 202, a wire bonding operation may be performed using wire bonding tool 212.

Figure 3B:
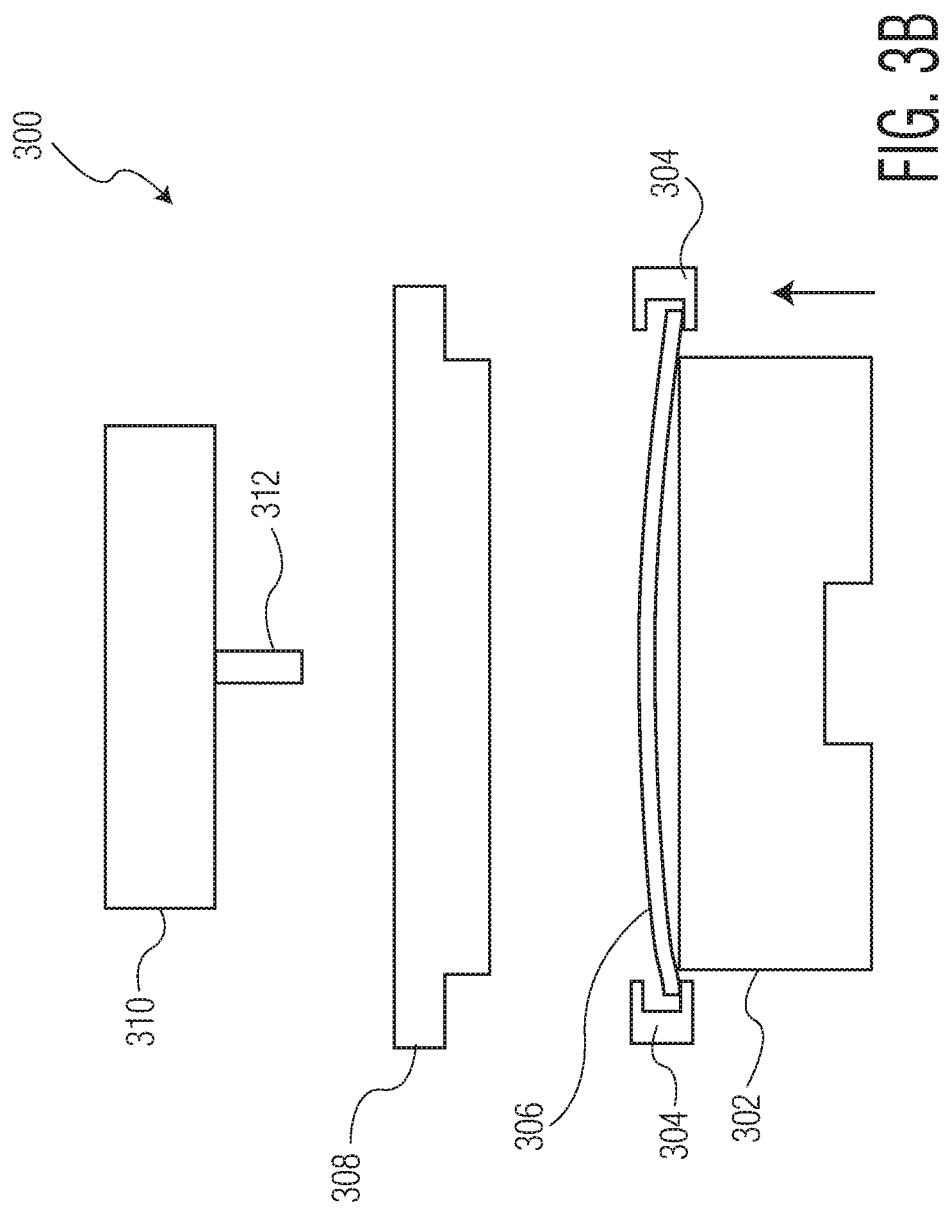

FIGS. 3A-3C illustrate elements of a wire bonding machine 300 used in connection with a method of operating the wire bonding machine 300. Specifically referring to FIG. 3A, a substrate 306 (e.g., a leadframe carrying a semiconductor die) is illustrated as being engaged between rails 304 of wire bonding machine 300. Rails 304 are part of a material handling system of wire bonding machine 300. Substrate 306 is shown having a warped bend profile. Such a bend profile may result in poor clamping during a wire bonding operation. Also shown in FIG. 3A is a support structure 302 (e.g., a heat block, an anvil, etc.) for supporting substrate 306 during a wire bonding operation, a clamping element 308 (e.g., a window clamp, a device clamp, a clamp insert, etc.) for securing substrate 306 to support structure 302 during the wire bonding operation, and a bond head assembly 310 carrying a bonding tool 312 for forming wire bonds on substrate 306. At FIG. 3B, support structure 302 is moved upward to be in contact with substrate 306 prior to contact between substrate 306 and clamping element 308. This contact between support structure 302 and substrate 306 changes a bend profile of substrate 306. At FIG. 3C, clamping element 308 has been lowered, and substrate 306 is secured against support structure 302 using clamping element 308. Vaccum pressure 302a is shown drawn through support structure 302. With clamping element 308 securing substrate 306 against support structure 302, a wire bonding operation may be performed using wire bonding tool 312.

FIGS. 4A-4C illustrate elements of a wire bonding machine 400 used in connection with a method of operating the wire bonding machine 400. Specifically referring to FIG. 4A, a substrate 206 (e.g., a leadframe carrying a semiconductor die) is illustrated as being engaged between rails 404 of wire bonding machine 400. Rails 404 are part of a material handling system of wire bonding machine 400. Substrate 406 is shown having a warped bend profile. Such a bend profile may result in poor clamping during a wire bonding operation. Also shown in FIG. 4A is a support structure 402 (e.g., a heat block, an anvil, etc.) for supporting substrate 406 during a wire bonding operation, a clamping element 408 (e.g., a window clamp, a device clamp, a clamp insert, etc.) for securing substrate 406 to support structure 402 during the wire bonding operation, a bond head assembly 410 carrying a bonding tool 412 for forming wire bonds on substrate 406, and a fluid system 414 (e.g., an air jet system) to direct a fluid (e.g., air) from below substrate 406 to change the bend profile of substrate 406. At FIG. 4B, the fluid is directed upward from fluid system 414 toward substrate 406 to change a bend profile of substrate 406. At FIG. 4C, support structure 402 has been raised, clamping element 408 has been lowered, and substrate 406 is secured against support structure 402 using clamping element 408. Vaccum pressure 402a is shown drawn through support structure 402. With clamping element 408 securing substrate 406 against support structure 402, a wire bonding operation may be performed using wire bonding tool 412.

While the substrates 106/206/306/406 (in each of FIGS. 1A, 2A, 3A, and 4A, respectively) are each shown having the same warped bend profile, it is understood that various different undesirable (e.g., warped) bend profiles might exist in a substrate configured for wire bonding. The various systems and methods disclosed herein may be used in connection with various different undesirable bend profiles.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a wire bonding machine, the method comprising the steps of:
   (a) supporting a substrate on a material handling system of the wire bonding machine;
   (b) changing a bend profile of the substrate; and
   (c) securing, after step (b), the substrate against a support structure of the wire bonding machine using a clamping element of the wire bonding machine, the support structure for supporting the substrate during a wire bonding operation, and the clamping element for securing the substrate to the support structure during the wire bonding operation,
   wherein step (b) includes at least one of (i) contacting the substrate with the clamping element before contact with the support structure to change the bend profile; (ii) contacting the substrate with the support structure before contact with the clamping element to change the bend profile; and (iii) operating a fluid system to direct a fluid to change the bend profile of the substrate.

2. The method of claim 1 wherein step (a) includes supporting the substrate on a rail system of the material handling system.

3. The method of claim 1 wherein the substrate includes a leadframe.

4. The method of claim 1 wherein step (b) includes moving the clamping element to be in contact with the substrate prior to contact between the substrate and the support structure, the contact between the clamping element and the substrate changing the bend profile of the substrate.

5. The method of claim 1 wherein step (b) includes moving the support structure to be in contact with the substrate prior to contact between the substrate and the clamping element, the contact between the support structure and the substrate changing the bend profile of the substrate.

6. The method of claim 1 wherein step (b) includes operating the fluid system to direct the fluid to change the bend profile of the substrate.

7. The method of claim 1 wherein the fluid system is an air jet system of the wire bonding machine.

8. The method of claim 1 wherein the support structure is a heat block of the wire bonding machine configured to heat the substrate during the wire bonding operation.

9. The method of claim 1 wherein the support structure includes a vacuum system to draw the substrate against the support structure prior to the wire bonding operation.

10. A method of operating a wire bonding machine, the method comprising the steps of:
    (a) supporting a substrate on a material handling system of the wire bonding machine;
    (b) moving a clamping element of the wire bonding machine to be in contact with the substrate prior to contact between the substrate and a support structure of the wire bonding machine, the support structure for supporting the substrate during a wire bonding operation, the contact between the clamping element and the substrate changing a bend profile of the substrate; and
    (c) securing, after step (b), the substrate against the support structure using the clamping element of the wire bonding machine, the clamping element for securing the substrate to the support structure during the wire bonding operation.

11. A method of operating a wire bonding machine, the method comprising the steps of:
    (a) supporting a substrate on a material handling system of the wire bonding machine;
    (b) moving a support structure of the wire bonding machine to be in contact with the substrate prior to contact between the substrate and a clamping element of the wire bonding machine, the support structure for supporting the substrate during a wire bonding operation, the contact between the support structure and the substrate changing a bend profile of the substrate; and
    (c) securing, after step (b), the substrate against the support structure using the clamping element of the wire bonding machine, the clamping element for securing the substrate to the support structure during the wire bonding operation.

12. A method of operating a wire bonding machine, the method comprising the steps of:
    (a) supporting a substrate on a material handling system of the wire bonding machine;
    (b) changing a bend profile of the substrate using a fluid system of the wire bonding machine, the fluid system being configured to direct a fluid to change the bend profile of the substrate; and
    (c) securing, after step (b), the substrate against a support structure of the wire bonding machine using a clamping element of the wire bonding machine, the support structure for supporting the substrate during a wire bonding operation, and the clamping element for securing the substrate to the support structure during the wire bonding operation.

13. The method of claim 12 wherein the fluid system is an air jet system configured to direct air from above the substrate to change the bend profile of the substrate.

14. The method of claim 12 wherein the fluid system is an air jet system configured to direct air from below the substrate to change the bend profile of the substrate.

15. A wire bonding machine comprising:
a bond head assembly including a wire bonding tool for bonding a portion of wire to a substrate at a bonding area of the wire bonding machine;
a material handling system for providing the substrate to the bonding area;
a support structure for supporting the substrate during a wire bonding operation;
a clamping element for securing the substrate to the support structure during the wire bonding operation; and
a fluid system configured to direct a fluid to change a bend profile of the substrate.

16. The wire bonding machine of claim 15 wherein the fluid system includes an air jet system to direct air to the substrate to change the bend profile of the substrate.

17. The wire bonding machine of claim 15 wherein the fluid system includes an air jet system configured to direct air to the substrate, from a position above the substrate, to change the bend profile of the substrate.

18. The wire bonding machine of claim 15 wherein the fluid system includes an air jet system configured to direct air to the substrate, from a position below the substrate, to change the bend profile of the substrate.

19. The wire bonding machine of claim 15 wherein the material handling system includes a rail system for providing the substrate to the bonding area.

20. The wire bonding machine of claim 15 wherein the fluid system is configured to direct the fluid to change the bend profile of the substrate prior to the clamping element securing the substrate to the support structure during the wire bonding operation.

* * * * *